United States Patent
Benzel et al.

(10) Patent No.: US 8,123,963 B2
(45) Date of Patent: *Feb. 28, 2012

(54) METHOD FOR PRODUCING A SEMICONDUCTOR COMPONENT AND A SEMICONDUCTOR COMPONENT PRODUCED ACCORDING TO THE METHOD

(75) Inventors: Hubert Benzel, Pliezhausen (DE); Heribert Weber, Nuertingen (DE); Hans Artmann, Magstadt (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 787 days.

This patent is subject to a terminal disclaimer.

(21) Appl. No.: 12/152,241

(22) Filed: May 12, 2008

(65) Prior Publication Data

US 2008/0286970 A1    Nov. 20, 2008

Related U.S. Application Data

(63) Continuation of application No. 11/221,228, filed on Sep. 6, 2005, now Pat. No. 7,479,232, which is a continuation of application No. 10/070,286, filed as application No. PCT/DE01/01516 on Apr. 20, 2001, now Pat. No. 7,037,438.

(30) Foreign Application Priority Data

Jul. 5, 2000 (DE) .................................. 100 32 579

(51) Int. Cl.
*H01L 21/302* (2006.01)
*B81C 1/00* (2006.01)

(52) U.S. Cl. .................. 216/2; 216/56; 216/99; 438/53; 438/753; 438/795; 205/223

(58) Field of Classification Search .................. None
See application file for complete search history.

(56) References Cited

U.S. PATENT DOCUMENTS

| | | | | |
|---|---|---|---|---|
| 4,680,963 A | * | 7/1987 | Tabata et al. | 73/204.18 |
| 5,139,624 A | | 8/1992 | Searson et al. | |
| 5,298,767 A | * | 3/1994 | Shor et al. | 257/77 |
| 5,311,775 A | * | 5/1994 | Suski et al. | 73/204.26 |
| 5,352,635 A | | 10/1994 | Tu et al. | |
| 5,604,144 A | * | 2/1997 | Kurtz | 438/53 |

(Continued)

FOREIGN PATENT DOCUMENTS

CN        1251945        5/2000

(Continued)

OTHER PUBLICATIONS

Rinke et al., "Quasi-Monocrystalline Silicon for Thin-Film Devices," Applied Physics A: Materials Science and Processing, Springer Verlag, Berlin, Federal Republic of Germany (Jun. 1999)*.

(Continued)

*Primary Examiner* — Anita Alanko
(74) *Attorney, Agent, or Firm* — Kenyon & Kenyon LLP

(57) ABSTRACT

A method for producing a semiconductor component includes forming an n-doped layer in a p-doped layer of the semiconductor component, wherein the n-doped layer comprises at least one of: a sieve-like layer or a network-like layer. The method also includes porously etching the p-doped layer between the material of the n-doped layer to form a top electrode, and forming a cavity below the n-doped layer.

23 Claims, 8 Drawing Sheets

U.S. PATENT DOCUMENTS

| | | | |
|---|---|---|---|
| 5,674,406 A | | 10/1997 | Lee |
| 5,725,785 A | | 3/1998 | Ishida et al. |
| 5,834,333 A | * | 11/1998 | Seefeldt et al. ............... 438/52 |
| 6,359,276 B1 | | 3/2002 | Tu |
| 6,521,313 B1 | * | 2/2003 | Artmann et al. ............... 428/53 |
| 7,037,438 B2 | * | 5/2006 | Benzel et al. .................. 216/2 |
| 7,479,232 B2 | * | 1/2009 | Benzel et al. .................. 216/2 |
| 2003/0017712 A1 | | 1/2003 | Brendel |
| 2004/0065931 A1 | | 4/2004 | Benzel et al. |
| 2004/0069626 A1 | * | 4/2004 | Artmann et al. ............. 204/400 |
| 2004/0195096 A1 | | 10/2004 | Tsamis et al. |

FOREIGN PATENT DOCUMENTS

| | | |
|---|---|---|
| DE | 42 02 455 | 8/1993 |
| DE | 197 52 208 | 6/1999 |
| DE | 198 03 013 | 8/1999 |
| EP | 0 867 921 | 9/1998 |
| EP | 0 895 276 | 2/1999 |
| EP | 1 079 431 | 2/2001 |
| JP | 5-90113 | 4/1993 |
| JP | 8-37314 | 2/1996 |
| JP | 11-195562 | 7/1999 |
| RU | 2099813 | 12/1997 |
| WO | WO 98/53351 | 11/1998 |
| WO | WO 99/45583 | 9/1999 |

OTHER PUBLICATIONS

Jun-Hwan Sim et al., "Eight-beam piezoresistive accelerometer fabricated by using a selective porous-silicon etching method", pp. 273-278, Sensors and Actuators A66 (1988).

Walter Lange et al., Sensors and Materials, vol. 8, No. 6, "Pourous Silicon Technology for Thermal Sensors", pp. 327-344 (1986).

Rosemary L. Smith, "Electrochemical Microfabrication", The Electrochemical Society Proceedings, Proc. vol. 94-32, Miami Beach Conf., 10-12.10.1994, pp. 281-289 (1995).

V. Labunov et al., "Heat Treatment Effect on Porous Silicon", vol. 137, pp. 123-134, Thin Solid Films, 1.3. (1986).

Lammel, G. et al. "Free-standing, mobile 3D porous silicon microstructures" Sensors and Actuators A Physical, 85, pp. 356-360, Aug. 25, 2000.

Steiner et al, ITG Fachbericht 126: Sensoren—Technologie und Anwendung, XP002900484 pp. 285-290.

* cited by examiner

METHOD FOR PRODUCING A SEMICONDUCTOR COMPONENT AND A SEMICONDUCTOR COMPONENT PRODUCED ACCORDING TO THE METHOD

CROSS-REFERENCE TO RELATED APPLICATION

This application is a continuation of, and incorporates herein by reference in its entirety, prior application Ser. No. 11/221,228, which was filed on Sep. 6, 2005, now U.S. Pat. No. 7,479,232, which is a continuation of prior application Ser. No. 10/070,286, filed Jul. 8, 2002, now U.S. Pat. No. 7,037,438, which was a National Stage Application of PCT International Application No. PCT/DE01/01516 filed Apr. 20, 2001.

FIELD OF THE INVENTION

The present invention relates to a method for producing a semiconductor component, e.g., a multilayer semiconductor component, and a semiconductor component produced according to the method.

BACKGROUND INFORMATION

Semiconductor components, particularly micromechanical pressure sensors, are typically produced using bulk or surface micromechanics. The production of bulk micromechanical components is relatively complicated and therefore expensive. In conventional surface micromechanical components, the production of a cavity is complicated. A typical process sequence for producing a cavity in surface micromechanics particularly includes depositing a sacrificial layer, depositing a membrane layer, which is typically made of polysilicon, producing openings in the membrane layer and/or opening a lateral etching channel, etching out the sacrificial layer, and sealing the openings, with the internal pressure of the cavity being defined upon sealing. Surface micromechanical pressure sensors produced in this way also have the disadvantage that a pressure acting upon them may typically only be evaluated via a capacitive method. Piezoresistive evaluation of the pressure acting upon them is difficult, since production of piezoresistive resistors from polycrystalline silicon is only possible through known surface micromechanical methods. These have the disadvantage of lower long-term stability than piezoresistive resistors made of monocrystalline silicon, as well as additionally having slight piezoelectric effect.

SUMMARY

The method according to the present invention may provide the advantage that a micromechanical component, e.g., a pressure sensor having piezoresistive resistors made of monocrystalline silicon, a capacitive pressure sensor, or a pressure sensor having resistors whose resistance value changes due to the deflection of a membrane of the pressure sensor when pressure is applied, may be produced easily and cost-effectively by surface micromechanics.

An aspect of the present invention is to provide a cavity in a semiconductor substrate, e.g., in a silicon substrate, using an etching medium. For this purpose, the cap layer of the substrate is etched in the region where cavities are to be produced subsequently, in such a way that openings, i.e., etched openings are made in the cap layer, e.g., pores or hollows. The etching medium or one or several subsequent etching media reach deeper regions of the substrate via the etched openings or pores, which are open to the outside. The part of the semiconductor substrate dissolved in this region by the etching medium and/or subsequent etching media may be removed via the openings, or pores of the cap layer and/or via an external access opening to this region. The cap layer may have a thickness from approximately 2 to 10 µm, e.g., 3 to 5 µm. In the case of an access opening, instead of a porous cap layer of approximately 2 to 10 µm, a porous cap layer may be produced which may have a thickness from approximately 40 to 80 µm, e.g., 50 to 60 µm. The greater thickness may allow the cap layer to be used as an etching buffer layer during the etching of the access opening and thus allowing the etching to be reliably stopped before an epitaxial layer deposited on the cap layer. In the case of a pressure sensor, the epitaxial layer deposited on the cover layer forms the actual sensor membrane.

In an example embodiment of the present invention, measures are used during the etching procedure which may ensure that the expansion speed of the pores in the cap layer is lower, e.g., significantly lower, than the expansion speed of the pores and/or hollows in the region of the substrate which forms the subsequent hollow and/or cavity.

This is achieved according to an example embodiment of the present invention in that the etching parameters and/or etching medium/media selected for the etching of the pores in the cap layer are different from the etching parameters and/or the etching medium/media selected for the etching of the pores or hollows in the region of the subsequent cavities.

The porosity of the cap layer may be adjustable using process technology so that it may be adequate for the removal of the silicon for producing the cavities. However, the cavities may be produced rapidly and therefore cost-effectively. According to an example embodiment of the present invention, it is provided that the etching parameters be adjusted and/or the etching medium/media for the etching of the cavity be selected so that the expansion speed of the pores and/or hollows is sufficiently high that the pores and/or hollows "overlap" with one another very rapidly. In this manner, one single largely planar starting hollow results initially in the substrate, which expands deeper as time progresses and forms the cavity.

In an example embodiment of the present invention, which is an alternative to the example embodiment immediately preceding, it is provided that the etching parameters and/or the etching medium/media for etching the cavity be selected so that the porosity of the region of the substrate which forms the subsequent cavity is greater than the porosity of the cap layer. The preliminary stage of the subsequent cavity may have a porosity of more than 80%. The cavity may be produced from the porous region of the substrate while performing one or more annealing steps, e.g., above approximately 900° C.

During annealing, e.g., under a hydrogen, nitrogen, or noble gas atmosphere, and at temperatures above approximately 900° C., the pores in the region of the silicon which forms the subsequent cavity rearrange themselves to a porosity of more than approximately 80%, due to which one single large pore, i.e., a hollow or a cavity, is made under the slightly porous cap layer, i.e., starting layer for an epitaxial layer to be deposited later. The pores on the top of the slightly porous layer, i.e., starting layer are largely closed during this high-temperature step, so that a largely monocrystalline silicon layer, which forms the actual sensor membrane, may be deposited on the starting layer.

According to an example embodiment of the present invention, the etching medium or the etching media for producing the openings or pores in the cover layer or for producing the cavity is/are hydrofluoric acid (HF) or a liquid mixture or a chemical compound which contains hydrofluoric acid.

In an example embodiment of the present invention, a volatile constituent, e.g., an alcohol, such as ethanol, and/or purified water is added to the etching medium and/or the etching media to dilute the etching medium or etching media.

Ethanol reduces the surface tension of an etching medium to which it is added, which allows better wetting of the silicon surface and improved penetration of the etching medium into etched pores, i.e., openings or hollows. Furthermore, the bubbles resulting during the etching procedure are smaller than those resulting without the addition of ethanol to the etching medium and the bubbles may thus escape more easily through the pores of the cap layer. Therefore, the pore size and/or the porosity of the cap layer may be kept smaller than without the addition of the alcohol.

In a further example embodiment of the present invention, the openings, i.e., pores in the cover layer, i.e., in the region of the subsequent cavity to be produced with an electrochemical method, e.g., using the etching medium or etching media previously described.

Furthermore, in an example embodiment of the present invention using an electrochemical etching method, e.g., an etching method using hydrofluoric acid (HF), the expansion speed of the pores or hollows resulting during the etching procedure be influenced by the application of an electric voltage and an electric current produced by this voltage through the etching medium or the etching media. The expansion speed of the pores or hollows may be dependent on the doping of the silicon substrate to be etched, the current density, possibly the HF concentration in the etching medium, and the temperature. The foregoing are merely examples of relevant method parameters of an etching method according to the present invention.

According to an example embodiment of the present invention, the etching medium, the HF concentration in the etching medium and/or the doping of the region to be etched and/or the temperature and possibly further process parameters of the etching method are selected so that the etching procedure, i.e., the pore or hollow formation may be adjusted and/or, by switching off the electrical voltage, e.g., rather abruptly.

In an example embodiment of an electrochemical etching method according to the present invention having one single etching medium or having two or more etching media, in a first time period, during which the etching medium is located in the region of the cap layer, a first current density is established in the etching medium which is not necessarily constant over time. During a second time period, during which the relevant etching medium is located in the region of the cavity to be produced, a second current density, which is not necessarily constant over time, may be established which is higher or significantly higher than the or a current density established during the first time period. In this manner, the cavity or a preliminary stage of the cavity is formed by pores or hollows, the expansion rate of which during the etching procedure of the cavity is higher or significantly higher than the expansion rate of the pores for producing the porous cap layer.

In a further example preferred embodiment of the present invention, it is provided that the region of the cap area of the substrate to be etched porously be surrounded before the etching procedure with a mask layer or a support layer which ensures free access of the etching medium and/or the etching media to the region to be etched porously and which shields the regions of the cap area of the substrate not to be etched porously from etching.

According to an example embodiment of the present invention, the support layer is of a type such that it mechanically secures the region or layer of the cover area to be made porous by etching on the unetched part of the substrate during and after the etching of the cavity.

In an example embodiment of the present invention, the support layer is produced before etching the region or the layer to be made porous by etching by providing at least the region immediately surrounding the layer to be made porous by etching of the cover area of a p-doped silicon substrate with n-doping. In this manner, "underetching" of the substrate, particularly in the region in which the porously etched layer is mechanically bonded with the silicon substrate, may be largely prevented. On the other hand, the danger exists, e.g., with a thin porous layer or starting layer, that this layer detaches from the substrate. In addition, a silicon nitride layer may be used as masking and, e.g., for protection against etching of possible underlying electronic circuits.

Alternatively or supplementarily, instead of the n-doping and/or n-doped layer, a metal layer or metal mask may be provided which also extensively prevents underetching of the substrate. The use of a metal layer and/or metal mask may be, however, only expedient, generally, if no circuits are to be provided in the substrate, since otherwise metal atoms remaining in the substrate even after the removal of the metal layer or metal mask may impair the function of the circuits.

In a further example embodiment of the present invention, it is provided that a porously etched cap layer, e.g., a silicon layer, be pretreated before an epitaxial layer, e.g., a largely monocrystalline silicon layer, is applied, i.e., deposited thereon. The pre-treatment furthers the goal of partially or completely sealing the pores in the porously etched cap layer, i.e., starting layer in order to further improve the quality of the largely monocrystalline silicon layer, if this is necessary or expedient.

A pre-treatment according to the present invention may include annealing of the porously etched cap layer and/or starting layer, with the annealing being performed at a high temperature, for example at a temperature in the range from approximately 900° C. to approximately 1100° C. The annealing may be performed under a hydrogen, nitrogen, and/or noble gas atmosphere.

Alternatively or supplementarily to the pre-treatment previously described, the silicon starting layer made porous by etching may be (slightly) oxidized. The oxidation may be performed with the (slight) addition of oxygen into the atmosphere to which the starting layer is exposed in the reactor, with the oxidation, e.g., occurring at a temperature in the range from approximately 400° C. to 600° C. "Slight" oxidation is to be understood as oxidation which largely seals only the pores of the starting layer completely or partially and forms a network-like oxide structure. The oxide structure is, according to the present invention, to cover the surface of the starting layer made porous by etching as little as possible, in order to ensure that a silicon layer forming the actual sensor membrane which is as monocrystalline as possible may be deposited on the starting layer. If necessary, the oxidation is removed in a subsequent processing step until this desired state is reached.

In an example embodiment of the present invention, the thickness of the starting layer is significantly less than the thickness of the silicon layer deposited thereon, so that the physical behavior of the sensor membrane is largely determined by the silicon layer, the thickness of which may be adjusted well in processing technology.

According to an example embodiment of the present invention, the slightly porous layer or starting layer for the deposition of an epitaxial layer, which, for example, forms the membrane of a pressure sensor, is etched with an etching medium having a hydrofluoric acid concentration (HF concentration) in the range from approximately 20% to approximately 50%, e.g., approximately 30% to approximately 40%, e.g., 33%.

In a further example embodiment of the present invention, the porous layer, which forms a preliminary stage of the subsequent hollow or cavity, is etched with an etching medium having a hydrofluoric acid concentration (HF concentration) in the range from approximately 0% to approximately 40%, e.g., approximately 5% to approximately 20%, e.g., less than approximately 20%. The remaining part of the etching medium, which is not made up of hydrofluoric acid, may largely include an alcohol, such as ethanol.

In order to achieve high expansion speed of the pores and/or hollows in the layer to be dissolved during a previously described etching step according to the present invention for forming a hollow or cavity, at which the pores or hollows "overlap" very rapidly with one another and thus form a single "giant pore", in an example embodiment of the present invention according to the present invention, an etching medium according to the present invention is provided. The etching medium according to the present invention has a hydrofluoric acid concentration (HF concentration) in the range from approximately 0% to approximately 5%, e.g., approximately 1% to approximately 3%, e.g., less than approximately 5%. The remaining part of this etching medium, which is not made up of hydrofluoric acid, may largely include an alcohol, particularly ethanol, and/or purified water.

The method according to the present invention for producing a multilayer semiconductor element according to the present invention is described in more detail below with reference to the example of a pressure sensor using a schematic diagram, which is not necessarily to scale, with the same reference numbers referring to layers or parts that are identical or have identical functions.

DETAILED DESCRIPTION

Figure 1A:
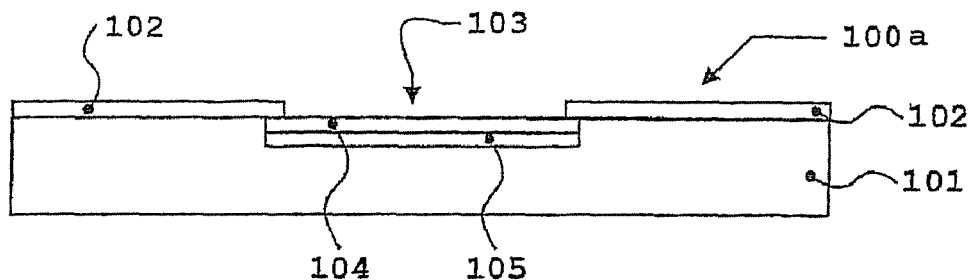
FIG. 1 is a cross-sectional view of a first example embodiment of a preliminary stage of a pressure sensor after the production of a silicon membrane having low porosity in a silicon substrate having a porous silicon layer, underlying the silicon membrane, which has higher porosity than the silicon membrane.
Figure 1B:
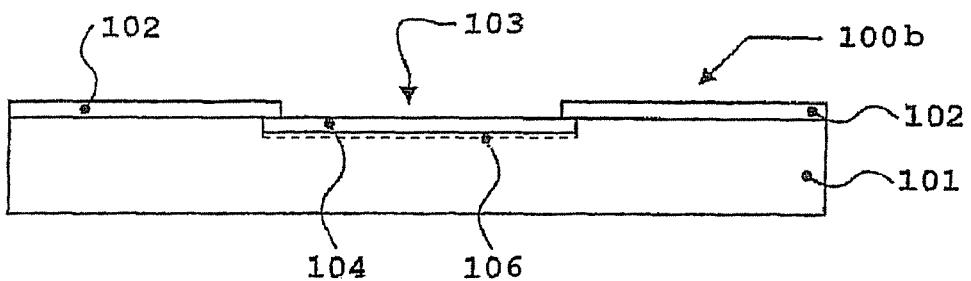
Figure 5:
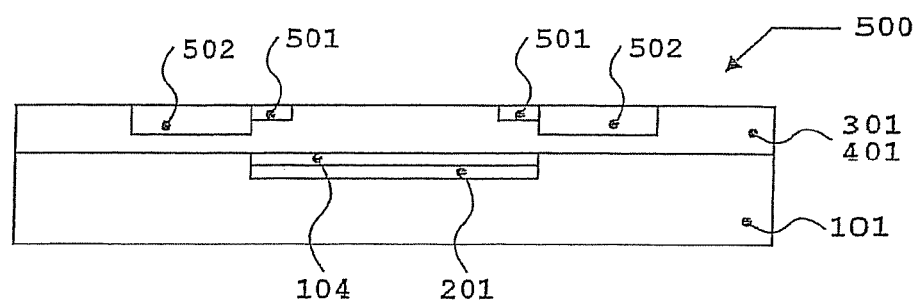
FIG. 5 is a cross-sectional view of an absolute pressure sensor produced on the basis of the preliminary stages illustrated in FIG. 3 or 4, which has been provided with monocrystalline, piezoresistive resistors and doped supply leads.

FIG. 1 is a cross-sectional view of an example embodiment of a preliminary stage 100 of absolute pressure sensor 500 illustrated in FIG. 5. To manufacture absolute pressure sensor 500 illustrated in FIG. 5, first a mask layer 102 is produced on the top of a silicon substrate 101, resulting in a region 103 not covered by mask layer 102. The mask layer may, for example, be a nitride layer, an n-doped layer (for p-doped silicon substrate), or another suitable layer which will largely not be attacked by the etching medium used subsequently.

The top of silicon substrate 101 is electrochemically etched using a suitable etching medium so that the etching medium generates small openings or pores in silicon substrate 101 directly under uncovered region 103. A silicon layer 104 having low porosity results. The etching medium reaches deep-lying regions of silicon substrate 101 through the small openings or pores of silicon layer 104 and also forms pores in the silicon located there. In this manner, a porous silicon layer 105 results below porous silicon layer 104.

The etching medium for electrochemical etching, e.g., wet etching, may be hydrofluoric acid (HF) or an etching medium which contains, among other things, hydrofluoric acid (HF). According to the present invention, an electrical field may be generated between the top and the bottom of silicon substrate 101, with the expansion speed of the pores, i.e., openings or hollows being influenced via the electrical field strength applied or the electrical current density applied.

In an example embodiment of an electrochemical etching method according to the present invention, preliminary stages of the pressure sensors to be etched are placed in a trough-shaped vessel which is filled with the etching medium, and an electrical voltage is applied to opposite ends of the etching medium in such a way that the electrical field results.

In order to ensure that porous silicon layer 104 results in the region directly below region 103 not covered by mask layer 102, in a first step, an electrical current density, which is not necessarily constant, is established on uncovered region 103 after the application of the etching medium. It may be selected so that openings or pores result in silicon substrate 101 directly below uncovered region 103.

A further important criterium for the current density established in the first step, which is not necessarily constant, may be that such an electrical current density be applied that suitable openings or pores are formed in silicon substrate 101 directly below uncovered region 103. Openings or pores which subsequently allow an extensively monocrystalline silicon layer, which forms the actual sensor membrane, to be deposited on porous silicon layer 104 formed during the etching procedure may be suitable. Therefore, the openings or pores may only have an adequate size, i.e., an adequate diameter. Openings or pores may have, for example, a diameter of approximately 10 to 100 nm, e.g., approximately 10-30 nm. The foregoing is merely an example of suitable openings or pores.

After the etching medium has penetrated porous silicon layer 104, in a second step the current density may be increased relative to the current density during the first step, which increases the expansion rate of the pores or hollows and due to which pores result in silicon layer 105 which are larger than the pores in porous silicon layer 104.

The silicon dissolved by the etching medium is removed during the etching procedure and/or subsequently via the openings or pores in porous silicon layer 104 and "fresh" etching medium is introduced.

In the first example embodiment illustrated in FIG. 1 of the method according to the present invention for producing the preliminary stage of a pressure sensor, i.e., hollow, the etching procedure for producing subsequent hollow 201 (FIG. 2) is adjusted by the selection of suitable process parameters and/or one or more suitable etching media so that the porosity of silicon layer 105, which forms subsequent hollow 201, is sufficiently great. "Sufficient" may be understood to mean a porosity which is greater than 80 percent and less than 100 percent. Subsequently, annealing is performed. The annealing may occur under a hydrogen, nitrogen, or noble gas atmosphere and/or at a temperature above approximately 900° C. Due to the high porosity of silicon layer 105, the pores rearrange themselves during the annealing so that one single large pore results under slightly porous silicon layer 104, i.e. hollow and/or cavity 201 illustrated in FIG. 2. The pores on the top of slightly porous silicon layer 104 are largely sealed during the annealing and/or the high-temperature step, so that the actual sensor membrane may be deposited as a largely monocrystalline silicon layer on this layer.

In a second example embodiment according to the present invention for producing the preliminary stage of a pressure sensor, i.e., hollow 201, the processing parameters are adjusted after the formation of silicon layer 104 of lower porosity so that the expansion speed of the pores and/or hollows within a thin transition layer under silicon layer 104 increases strongly, with the pores in this transition layer growing together or quasi-"overlapping" one another. In other words, the transition layer is an initially planar hollow, which grows in depth during the further etching procedure and finally forms hollow or cavity 201. This means that pores are not first etched and then enlarged, rather the transition layer, a planar "giant pore" initially having low thickness, slowly grows in depth. According to the present invention, the etching medium or the etching media may be provided with a highly volatile component. An alcohol such as ethanol may be used.

If it is necessary or expedient, it is provided according to the present invention that the region of the cap area of substrate 101 to be porously etched be provided with a mask layer and/or support layer which mechanically fixes the layer of the cap layer to be porously etched, i.e. silicon layer 104, at the junctions in the region of the non-etched cap area of the substrate during and after the etching, i.e., during the production of hollow 201.

Such a support layer may, for example, be produced by providing at least the region immediately surrounding silicon layer 104, which is to be porously etched, of the cap area of p-doped silicon substrate 101 with—type doping. In this manner, "underetching" of silicon substrate 101 in the region of the junctions and/or boundary surfaces between silicon layer 104 and silicon substrate 101 may be largely prevented. Furthermore, care may also be taken that a thin porous silicon layer 104, which forms the starting layer of silicon epitaxial layer 301 or 401 (FIGS. 3 and 4), is reliably affixed to silicon substrate 101.

Figure 2:
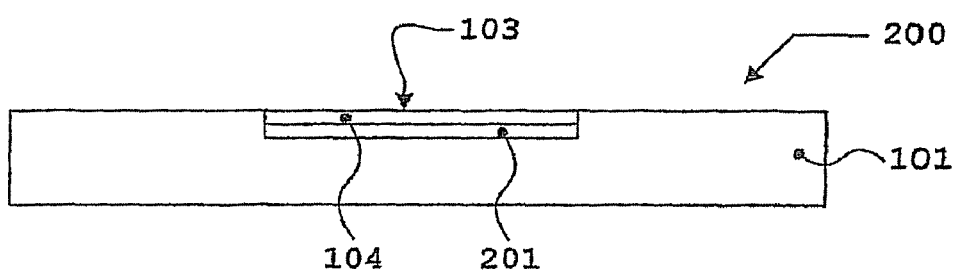
FIG. 2 is a cross-sectional view of the first preliminary stage illustrated in FIG. 1 after the silicon layer having higher porosity underlying the silicon membrane has become a hollow.
Figure 3:
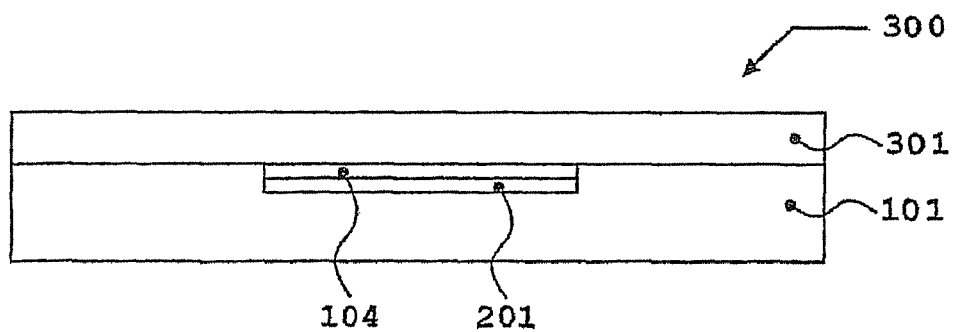
FIG. 3 is a cross-sectional view of a first example embodiment of a further preliminary stage of a pressure sensor produced on the basis of the preliminary stage illustrated in FIG. 2, after the porous silicon membrane has been pretreated and then provided with an epitaxial layer, which forms the actual membrane of the pressure sensor.

FIG. 3 is a cross-sectional view of a first example embodiment of a preliminary stage of absolute pressure sensor 500, which is illustrated in FIG. 5, produced on the basis of the preliminary stage illustrated in FIG. 2, after porous silicon membrane or silicon layer 104 has been pretreated and then provided with a largely monocrystalline silicon epitaxial layer 301. The pressure obtaining during the epitaxy process and/or during the deposition of epitaxial layer 301 defines the pressure enclosed in hollow 201.

An example pretreatment according to the present invention includes annealing of porous silicon layer 104. The annealing may be performed at a high temperature, for example at a temperature in the range from approximately 900° C. to approximately 1100° C. and/or the annealing is performed under a hydrogen, nitrogen, and/or noble gas atmosphere.

The pretreatment allows the pores in porously etched, monocrystalline silicon layer 104 to be largely sealed, so that a largely monocrystalline silicon epitaxial layer 301 may be deposited on this layer. Such a pretreatment may be dispensed with, e.g., for reasons of cost, if the quality of the deposited silicon layer is satisfactory even without pretreatment.

Figure 4:
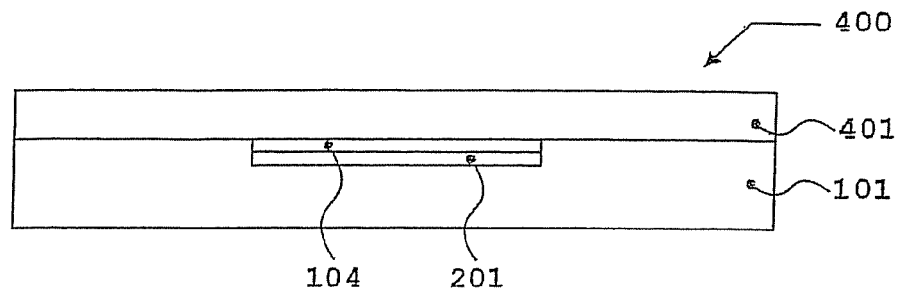
FIG. 4 is a cross-sectional view of a second example embodiment of a further preliminary stage of a pressure sensor produced on the basis of the preliminary stage illustrated in FIG. 2, after the porous silicon membrane has been provided with an epitaxial layer, which forms the actual membrane of the pressure sensor.

In contrast, FIG. 4 is a cross-sectional view of a second example embodiment of a further preliminary stage of absolute pressure sensor 500 illustrated in FIG. 5 produced on the basis of the preliminary stage illustrated in FIG. 2, after porous silicon membrane and/or silicon layer 104 has been provided, without pretreatment, with a silicon epitaxial layer 401, which is also largely monocrystalline. This again forms the actual membrane of the pressure sensor. The pressure which is obtained during the epitaxy process, i.e., during the deposition of epitaxial layer 401 defines, as during the deposition of epitaxial layer 301, the pressure enclosed in hollow 201. During the epitaxy process, which uses hydrogen as a carrier gas to produce epitaxial layer 301 or 401, primarily hydrogen is enclosed in hollow 201. If the epitaxy occurs approximately at atmospheric pressure and therefore at higher growth rates than at lower processing pressures, the enclosed hydrogen pressure is approximately 1 bar. In a high-temperature step according to the present invention, e.g. under a nitrogen atmosphere, the hydrogen, due to its lower molecular size and due to the gradients of the hydrogen concentration, particularly diffuses through epitaxial layer 301 or 401, which is thinner than the substrate generally. In this manner, a near vacuum results in cavity 201. Such a method step according to the present invention may be expedient in the production of an absolute pressure sensor. Its hollow has, generally, a pressure reduced relative to the atmosphere, e.g., a vacuum. Furthermore, it may be expedient to perform the high-temperature step according to the present invention under a hydrogen atmosphere, with the pressure of the hydrogen atmosphere, e.g., being set to the pressure which is desired in the cavity or in the hollow of the absolute pressure sensor.

The preceding method for producing a near vacuum in cavity 201 may also be used in epitaxy processes using hydrogen as a carrier gas at higher or lower overall pressures than approximately 1 bar.

Figure 6:
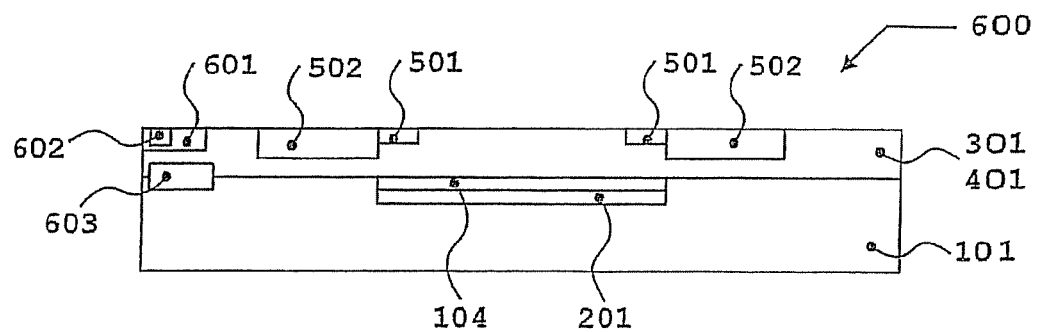
FIG. 6 is a cross-sectional view of the absolute pressure sensor illustrated in FIG. 5, which has been provided with circuits integrated into the sensor.

FIG. 5 is a cross-sectional view of an absolute pressure sensor 500 produced on the basis of the preliminary stage illustrated in FIG. 3 or 4. In absolute pressure sensor 500, monocrystalline, piezoresistive resistors 501 and supply leads 502 are generated in a conventional manner from doped silicon on largely monocrystalline silicon epitaxial layer 301 or 401. FIG. 6 is a cross-sectional view of an absolute pressure sensor 600 produced on the basis of absolute pressure sensor 500 illustrated in FIG. 5. Absolute pressure sensor 500 illustrated in FIG. 5 is provided in a conventional manner with integrated circuits 601, 602, and 603.

Figure 7:
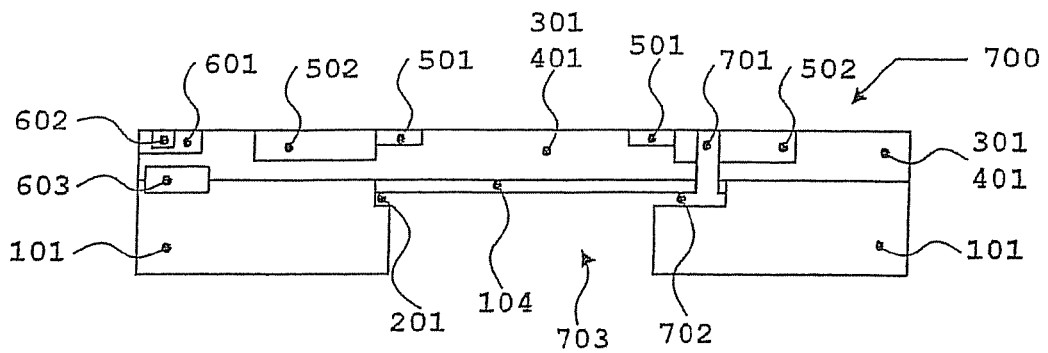
FIG. 7 is a cross-sectional view of a first example embodiment of a differential pressure sensor according to the present invention having an access opening and a lateral channel to the hollow.

FIG. 7 is a cross-sectional view of a first example embodiment of a differential pressure sensor 700 according to the present invention having an access opening 701 to hollow or cavity 201 via a lateral channel 702. The first example embodiment of differential pressure sensor 700 according to the present invention illustrated in FIG. 7 is produced like absolute pressure sensor 600 illustrated in FIG. 6.

For a differential pressure sensor, it may be desirable to be able to apply pressure from the back of membrane, i.e., epitaxial layer 301 or 401. For this purpose, it may be necessary to generate an opening 703 from the back of membrane and/or substrate 101 through suitable etching techniques. An opening 703, e.g., having largely perpendicular walls, may, for example, be generated by dry etching, such as plasma etching or trench etching. Plasma etching and trench etching stop at oxide layers. According to the present invention, it is thus provided that hollow 201 be provided with an oxide layer. Oxidation of hollow 201 before the deposition of silicon epitaxial layer 301 and/or 401 is, however, not possible, since an undesired polycrystalline epitaxial layer would then grow on slightly porous silicon layer and/or starting layer 104.

Figure 8:
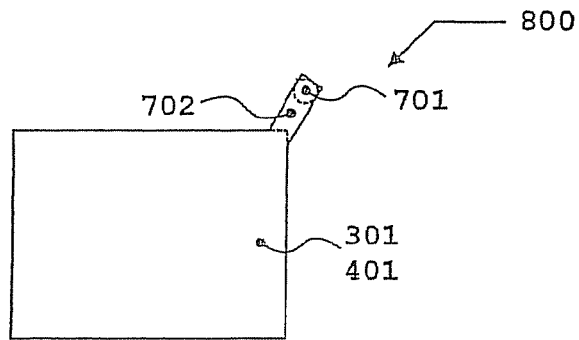
FIG. 8 illustrates a horizontal projection, the outline of the membrane region of the differential pressure sensor illustrated in FIG. 7.

If access opening 701 is outside the membrane region, as in the example embodiment illustrated in FIGS. 7 and 8, lateral channel 702 may be taken into consideration in mask layer 102 and lateral channel 702 may be produced together with hollow or cavity 201 in the manner described.

After the deposition of epitaxial layer 301 or 401, one or more holes or openings 701 from the top of epitaxial layer to hollow 201 are produced, for example by dry etching. This may be performed either directly in the membrane region (the region of epitaxial layer 301 and/or 401 outside opening 703, cf. also FIG. 8) or outside the membrane, as illustrated in FIGS. 7 and 8.

After the production of hollow 201, lateral channel 702, and access opening 701, the walls of hollow or cavity 201, lateral channel 702, and access opening 701 are oxidized in a conventional manner in an oxidation step.

The oxidation step may already be necessary for the production of circuit elements and may not require any additional expense. If the size of access opening 701 is selected suitably, it is already sealed by the oxidation step. Otherwise, access opening 701 may be sealed by a special sealing step or by the use of further processing steps necessary to produce circuit elements, such as by the deposition of oxide, nitride, metal, etc.

In a subsequent method step, opening 703 of the bottom of substrate and/or wafer 101 is formed by dry etching, e.g., trench etching. This etching process stops at the oxide layer, which delimits the hollow from below. Through an etching step which follows this, such as a dry etching step or a wet chemical etching step, the thin oxide layer delimiting the hollow from below and an oxide mask possibly present on the back of the wafer are removed and hollow or cavity 201 is opened.

Figure 9:
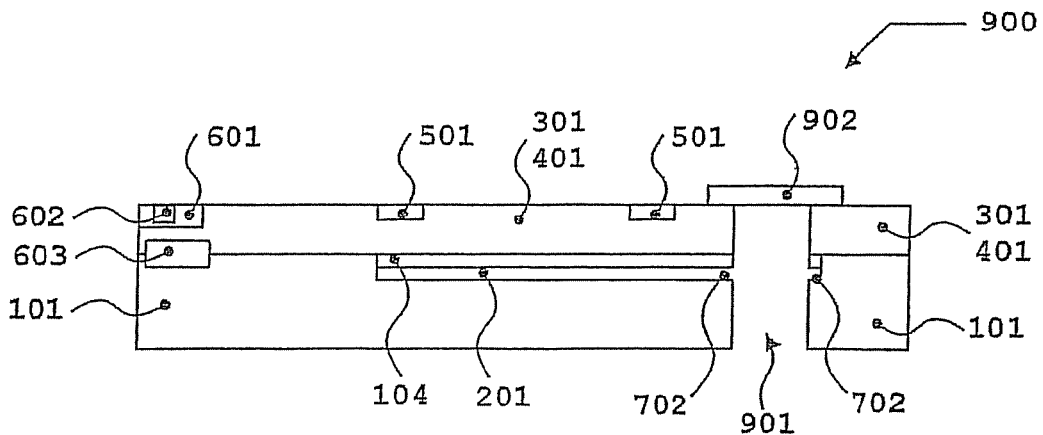
FIG. 9 is a cross-sectional view of a second example embodiment of a differential pressure sensor according to the present invention having an access opening to the hollow.

FIG. 9 is a cross-sectional view of a second example embodiment of a differential pressure sensor 900 according to the present invention having an access opening 901 to hollow 201. As described in connection with FIGS. 7 and 8, a lateral channel 702 is produced. Instead of access opening 701 in the first example embodiment of a differential pressure sensor 700 according to the present invention illustrated in FIGS. 7 and 8, in differential pressure sensor 900 illustrated in FIG. 9, an oxide stop layer 902 is deposited on epitaxial layer 301 or 401 at least above lateral channel 702. Analogously to the method described in connection with FIGS. 7 and 8, an opening 901 is produced below oxide stop layer 902 in a subsequent etching step, e.g., by trench etching. In this case, the etching process stops in the region of lateral channel 702 at the bottom of oxide stop layer 902, which is located above epitaxial layer 301 or 401.

To increase the stability of epitaxial layer 301 or 401, oxide stop layer 902 may be reinforced by further layers. Not using a lateral channel, but rather providing the opening in the membrane region, is also possible.

Figure 10:
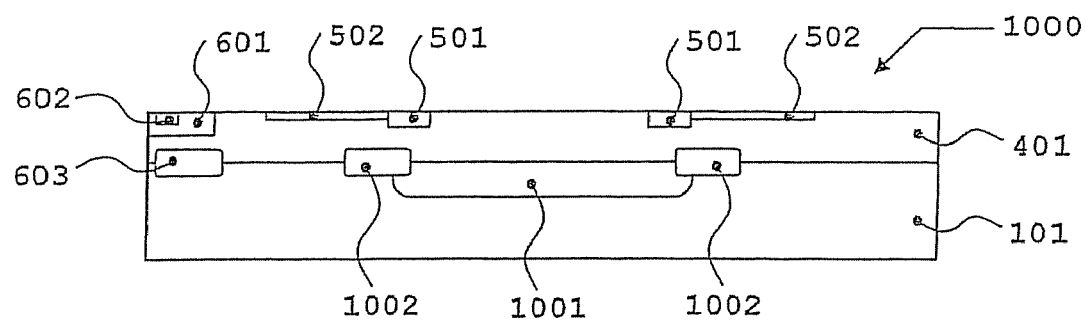
FIG. 10 is a cross-sectional view of a preliminary stage of a third example embodiment of a differential pressure sensor according to the present invention having one single thick porous layer.
Figure 11:
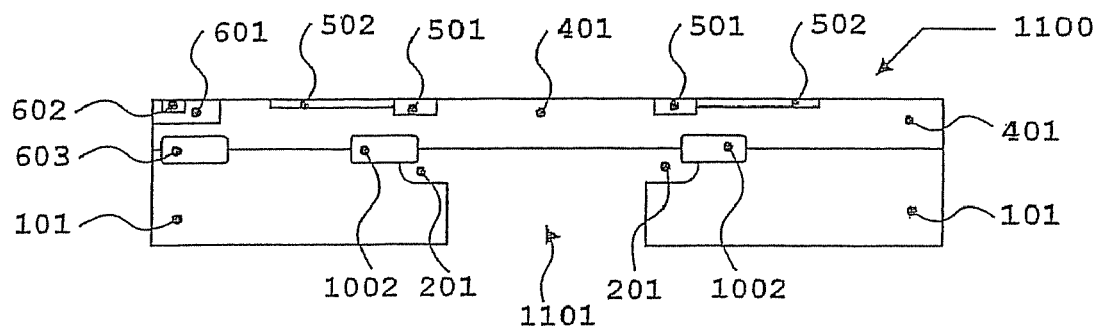
FIG. 11 is a cross-sectional view of the preliminary stage illustrated in FIG. 10 having a first access opening.
Figure 12:
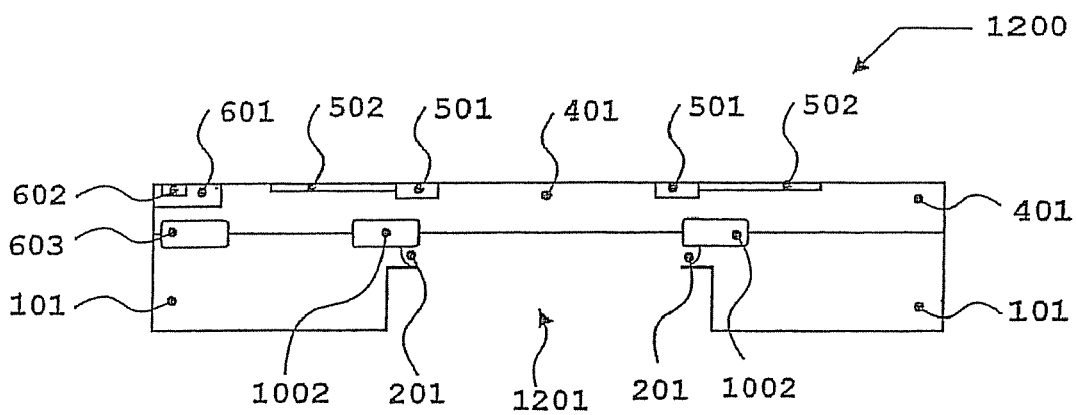
FIG. 12 is a cross-sectional view of the preliminary stage illustrated in FIG. 10 having a second access opening.

FIG. 10 is a cross-sectional view of a preliminary stage 1000 of a third example embodiment of a differential pressure sensor 1100 or 1200 according to the present invention having one single thick porous layer 1001. Thick porous layer 1001 is produced in a manner analogous to the manner described in connection with FIGS. 1 to 4. Porous layer 1001 may be, however, significantly thicker than slightly porous silicon layer 104. In contrast to differential pressure sensors 700 and 900, the formation of a hollow or cavity 201 before the formation of a hollow 1101 or 1201, which is open on one side, (cf. FIGS. 11 and 12) is not necessary. The regions indicated with 1002 are doped regions of substrate 101 which delimit underetching at the edge of the membrane, which extends over the hollow, which is open on one side, (cf. FIGS. 11 to 14). This is appropriate due to the high etching depth to produce thick porous layer 1001, for example approximately 50 μm. The membrane is thus somewhat stiffer at the membrane edge.

Proceeding from the preliminary stage of a differential pressure sensor 1100 or 1200 according to the present invention illustrated in FIG. 10, hollow 1101 or 1201, open on one side, is produced from the back of substrate and/or wafer 101 using isotropic or anisotropic etching techniques, e.g., using high rate trenches.

Due to the pores present in thick porous layer 1001, the layer may be selectively removed from the surrounding substrate material by etching solutions or etching gases. This removal may occur in the same processing step as the etching of the access opening to the back of the sensor membrane and for producing hollow 1101 or 1201, which is open on one side.

The width of hollow 1101, which is open on one side, is less than the width of the membrane region and/or than the width of porous layer 1001, whereas in contrast the width of hollow 1201, which is open on one side, is greater than the width of the membrane region and/or the width of porous layer 1001.

Figure 13:
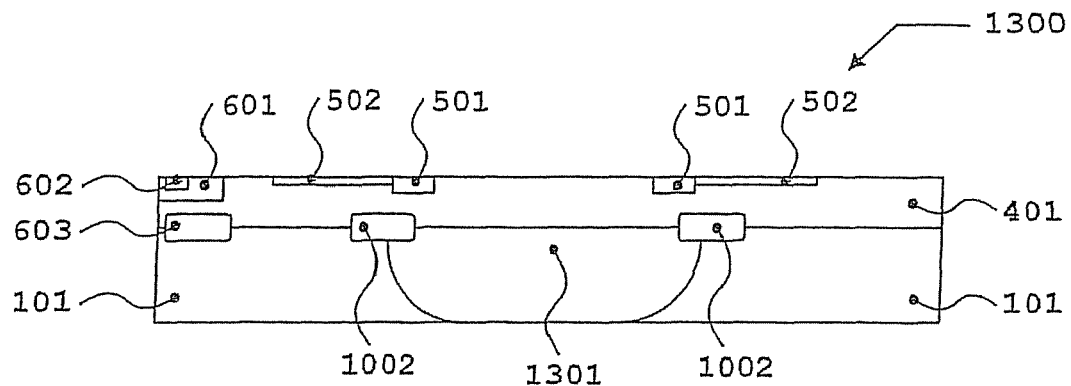
FIG. 13 is a cross-sectional view of a preliminary stage of a fourth example embodiment of a differential pressure sensor according to the present invention having a porous layer which extends up to the bottom of the substrate.
Figure 14:
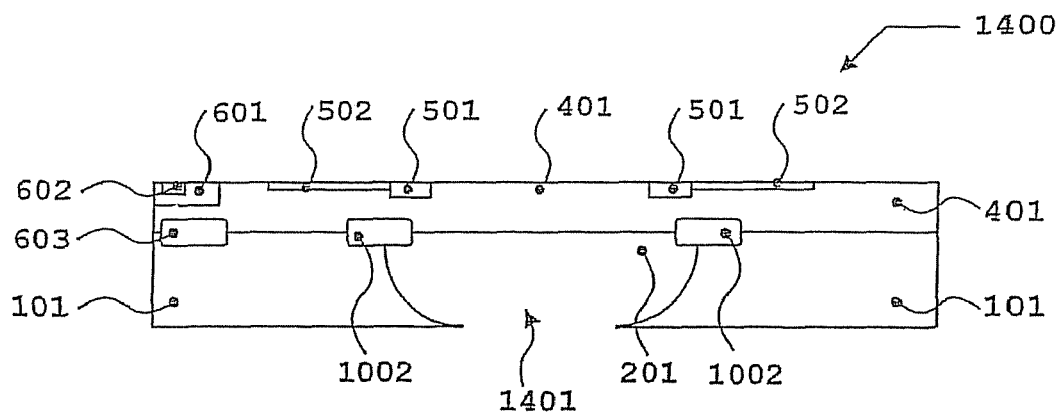
FIG. 14 is a cross-sectional view of the preliminary stage illustrated in FIG. 13 after the porous layer extending up to the bottom of the substrate has been removed.

FIG. 13 is a cross-sectional view of a preliminary stage 1300 of a fourth example embodiment of a differential pressure sensor 1400 according to the present invention. In preliminary stage 1300, porous layer 1301, in contrast to the preliminary stage illustrated in FIG. 10, extends up to the bottom of substrate 101. Porous layer 1301 may be selectively removed in the manner described in connection with FIGS. 10 to 12, without an access opening having to be etched. After the selective removal of porous layer 1301, a hollow 1401, which is open on one side, is located under sensor membrane, i.e., epitaxial layer 401.

Figure 15:
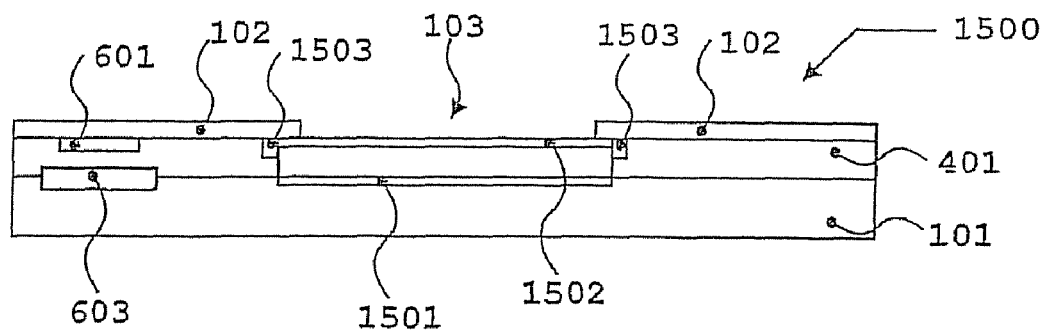
FIG. 15 is a cross-sectional view of a preliminary stage of a capacitive absolute pressure sensor according to the present invention.
Figure 16:
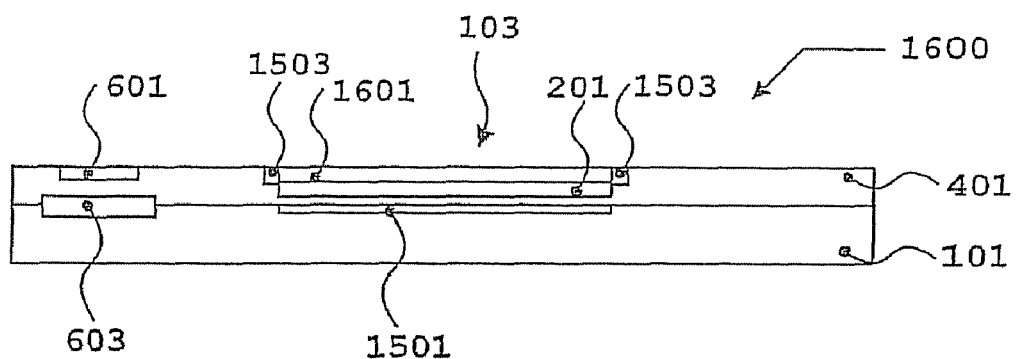
FIG. 16 is a cross-sectional view of the preliminary stage illustrated in FIG. 15 after the production of a porous silicon membrane having a hollow underlying the silicon membrane.

Preliminary stage 1500, illustrated a cross-section in FIG. 15, of a capacitive absolute pressure sensor 1600 according to the present invention (FIG. 16) is produced by standard semiconductor processes. In addition to integrated circuits 601 and 603 for evaluating the measurement signals output from capacitive absolute pressure sensor 1600, a bottom electrode 1501, e.g., produced by suitable doping of silicon substrate 101, is provided on the top of silicon substrate 101, and a silicon epitaxial layer 401, which is, e.g., monocrystalline, is provided on the top of silicon substrate 101 and bottom electrode 1501. On the top of silicon epitaxial layer 401, a top electrode 1502, which may be produced by suitable doping, is provided in silicon epitaxial layer 401, displaced in height relative to bottom electrode 1501. The top of silicon epitaxial layer 401 is covered by a mask layer 102 to protect against an etching attack, except in region 103 of top electrode 1502.

Region 103, which is not covered by mask layer 102, is, as already described above, porously etched, e.g., electrochemically, e.g., using hydrofluoric acid (HF) or an etching medium which contains hydrofluoric acid. Proceeding from top electrode 1502, a porous top electrode and/or membrane 1601 thus results.

In an example embodiment of the present invention, top electrode 1502 is produced from a p-doped layer of epitaxial layer 401, which is also p-doped. A p-doped layer is porously etched by the etching medium. Bottom electrode 1501 may be formed by either a p-doped or an n-doped layer.

In an example embodiment of the present invention, both bottom electrode 1501 and top electrode 1502 are formed by a sieve-like or network-like, n-doped layer in p-doped epitaxial layer 401 or in p-doped substrate 101. The n-doped regions of the sieve-like or network-like layer may be very narrow and flat and may have a suitable distance to one another, so that they may be underetched well by the etching medium to form porous top electrode 1502.

An n-doped layer is largely not attacked by the etching medium, and the etching medium penetrates the sieve-like or network-like layer of top electrode 1502 to produce subsequent hollow 201. Hollow 201 may particularly be produced by one of the methods already described in connection with FIGS. 1 to 3. A sieve-like or network-like, e.g., also n-doped layer may also be provided for bottom electrode 1501. In this manner, a largely homogeneous electrical field may result during the electrochemical etching procedure.

An external pressure acting on top electrode 1502 of the absolute pressure sensor deflects top electrode 1502 toward bottom electrode 1501, which changes the capacitance of the capacitor formed by the two electrodes. The electronically evaluable capacitance is a measure for the absolute pressure acting on the top electrode.

In order to prevent underetching of epitaxial layer 401 in the contact region with porous top electrode 1502, the contact region may be n-doped around porous top electrode 1502, which causes the n-doped regions indicated with 1503 to result.

In a first example embodiment of the present invention, a sealing layer, e.g. a nitride layer, is subsequently deposited on porous top electrode and/or membrane 1601. The pressure applied during the deposition defines the pressure in hollow or cavity 201 (cf. the preceding example embodiments on this point). Upon a change in pressure, the distance between the top electrode and bottom electrode, and thus the capacitance, changes. The capacitance change is evaluated by integrated circuits 601 and 603.

In a second example embodiment of the present invention, membrane 1601 is sealed by an oxidation step and/or a sealing layer, such as an oxide layer. A further layer, e.g., a doped polysilicon layer or a metal layer, which has (possibly after structuring) the function of a top electrode, is deposited on oxidized membrane 1601 and/or on the sealing layer. The top electrode may also, for example, be provided in the form of a doped region in the further layer, e.g., in an undoped polysilicon layer.

Further layers may be deposited and structured both in the first and in the second example embodiment, for example to achieve stiffening of membrane 1601, e.g., in the central membrane region.

Figure 17:
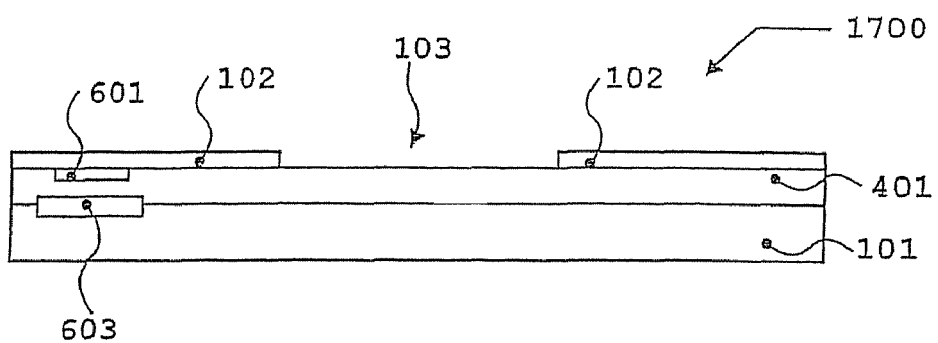
FIG. 17 is a cross-sectional view of a first example embodiment of a preliminary stage of a pressure sensor having resistors, the resistance of which changes due to the deflection of a membrane of the pressure sensor as pressure is applied.

FIG. 17 is a cross-sectional view of a first example embodiment of a preliminary stage 1700 of an absolute pressure sensor 2000 (cf. FIG. 20) having resistors, e.g., polycrystalline piezoresistive resistors or metal thin film resistors. Preliminary stage 1700, which is produced by standard semiconductor processes, for further preliminary stage 1900 illustrated in FIG. 19 has a silicon substrate 101, a silicon epitaxial layer 401 deposited on silicon substrate 101, and a mask layer 102 applied to the top of silicon epitaxial layer 401. Mask layer 102 is provided with an uncovered region 103. Furthermore, an integrated circuit 601 or 603 is produced both in the top of silicon epitaxial layer 401 and between silicon substrate and/or wafer 101 and epitaxial layer 401.

Figure 18:
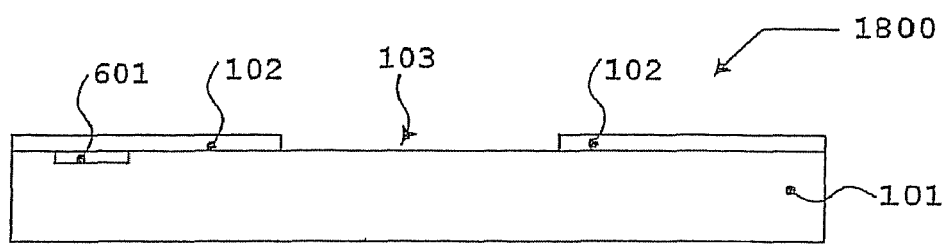
FIG. 18 is a cross-sectional view of a second example embodiment of a preliminary stage of a pressure sensor having resistors, the resistance of which changes due to the deflection of a membrane of the pressure sensor as pressure is applied.
Figure 20:
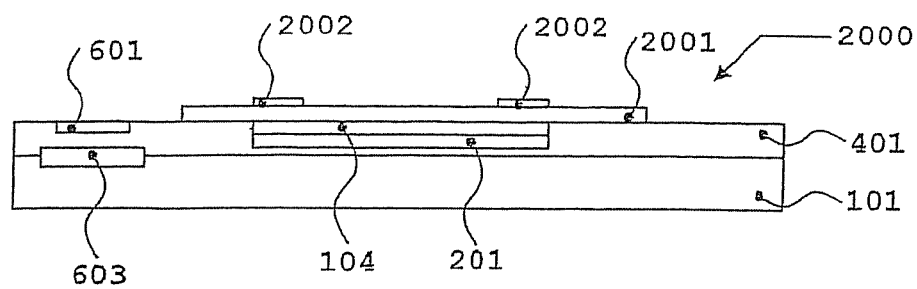
FIG. 20 is a cross-sectional view of the further preliminary stage illustrated in FIG. 19 after the porous silicon membrane has been provided with a sealing layer.

FIG. 18 is a cross-sectional view of a second example embodiment of a preliminary stage 1800 for producing absolute pressure sensor 2000 (FIG. 20). Alternative second preliminary stage 1800 differs from preliminary stage 1700 illustrated in FIG. 17 in that, instead of a silicon substrate 101 and a silicon epitaxial layer 401 deposited thereon, only one silicon substrate, i.e., wafer 101 is used as a preliminary stage for producing absolute pressure sensor 2000 (cf. FIG. 20), which, however, does not have a silicon epitaxial layer 401, in contrast to the example embodiment illustrated in FIG. 20.

Figure 19:
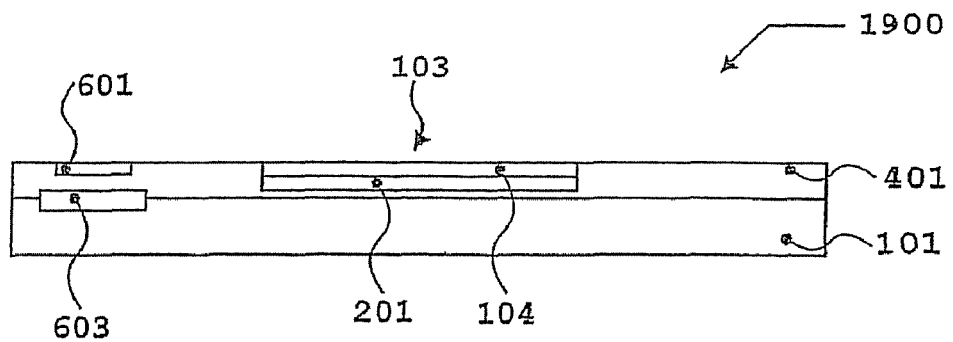
FIG. 19 is a cross-sectional view of the preliminary stage illustrated in FIG. 17 after the production of a porous silicon membrane in the silicon epitaxial layer deposited on the silicon substrate having a hollow underlying the silicon membrane.

A porous silicon membrane 104 and an underlying hollow or cavity 201 is produced in region 103 in silicon epitaxial layer 401 of preliminary stage 1700 or in silicon substrate 101 of preliminary stage 1800 with the method according to the present invention previously described, as is illustrated in FIG. 19 for preliminary stage 1700.

After the removal of mask layer 102, porous membrane 104 is sealed by the deposition of a sealing layer 2001, such as a nitride, oxide, or polysilicon layer or a monocrystalline silicon layer, or by oxidation. The pressure applied during the deposition of sealing layer 2001 and/or during oxidation defines the pressure enclosed in hollow and/or cavity 201 (cf. the preceding example embodiments on this point). Resistors 2002, e.g., polycrystalline piezoresistive resistors or metal thin film resistors, are produced on sealing layer 2001 or on the oxidized membrane. The production of resistors 2002 may, for example, be performed by depositing polysilicon on sealing layer 2001, subsequent doping of the deposited polysilicon, and subsequent structuring of the deposited polysilicon layer. Furthermore, resistors 2002 may, for example, be produced by the deposition of a polysilicon layer and structured doping of the polysilicon layer. The use of strain gauges is also possible.

A change in pressure leads to a change in deflection in the membrane formed by porous silicon layer 104 and sealing layer 2001 over hollow or cavity 201. This is accompanied by a change in resistance of piezoresistive resistors 2002, which may be evaluated by integrated circuits 601 and/or 603 or by a separate circuit.

Due to the greater long-term stability of monocrystalline piezoresistive resistors in relation to polycrystalline piezoresistive resistors, resistors 2002 are produced in a sealing layer 2001, which is a monocrystalline silicon layer.

Alternatively, pressure-dependent piezoresistive resistors 2002 may be formed in absolute pressure sensor 2000 illustrated in FIG. 20 by n-doped resistors in region of epitaxial layer 401, which forms subsequent porous silicon layer 104.

Figure 21:
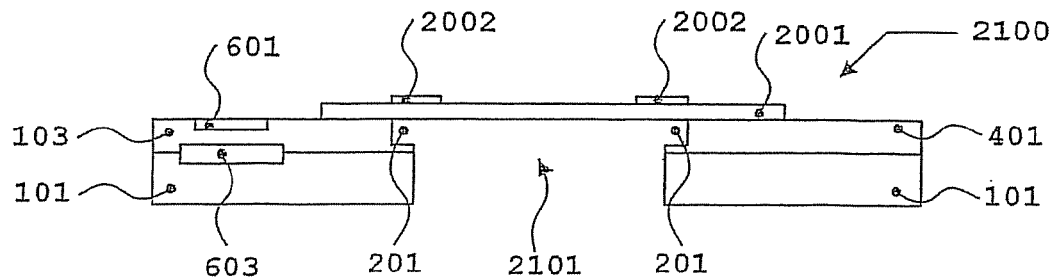
FIG. 21 is a cross-sectional view of a first example embodiment of a differential pressure sensor which has been produced on the basis of the absolute pressure sensor illustrated in FIG. 20.

It may be desirable for a differential pressure sensor if the pressure may be applied from the back of the membrane of the differential pressure sensor. In order to produce a differential pressure sensor 2100 (cf. FIG. 21) or a differential pressure sensor 2200 (cf. FIG. 22) from absolute pressure sensor 2000 illustrated in cross-section in FIG. 20, it may be necessary to produce an opening 2101 and/or an opening 2201 from the bottom of silicon substrate 101 to hollow or cavity 201.

According to the present invention, opening 2101 and/or 2201 may be produced by dry etching, e.g., trench etching and/or plasma etching (cf. the preceding example embodiments for producing openings by dry etching). Since such an etching process stops at oxide layers, it is provided according to the present invention in the example embodiment of a differential pressure sensor 2100 illustrated in FIG. 21 that hollow or cavity 201 be provided with an oxide layer. This is achieved if hollow or cavity 201 is sealed by oxidation of porous silicon layer 104. A silicon layer may be deposited on oxidized porous silicon layer or membrane 104, on or in which piezoresistive resistors 2002 are produced, e.g., by suitable doping of the silicon layer. Subsequently, a pressure is applied in the form of opening 2101 from the back of silicon substrate, i.e., wafer 101 in the membrane region, e.g., using a trench etching process. Such an etching process stops at the, e.g., thin oxide layer, which delimits hollow or cavity 201 from below. The oxide layer may, if necessary, be removed from the back of substrate, i.e., wafer 101 by a subsequent suitable dry etching step or by a wet chemical etching step. Hollow or cavity 201 is opened during this step.

The etching step may be such that all oxide is etched out of hollow or cavity 201 and thus oxidized porous silicon layer 104 is removed. The membrane thickness of differential pressure sensor 2100 may not only be determined by sealing layer 2001 deposited on oxidized porous silicon layer 104. The layer thickness of sealing layer 2001 may be set very precisely and reproducibly, which significantly simplifies the production of differential pressure sensors having reproducible properties.

Figure 22:
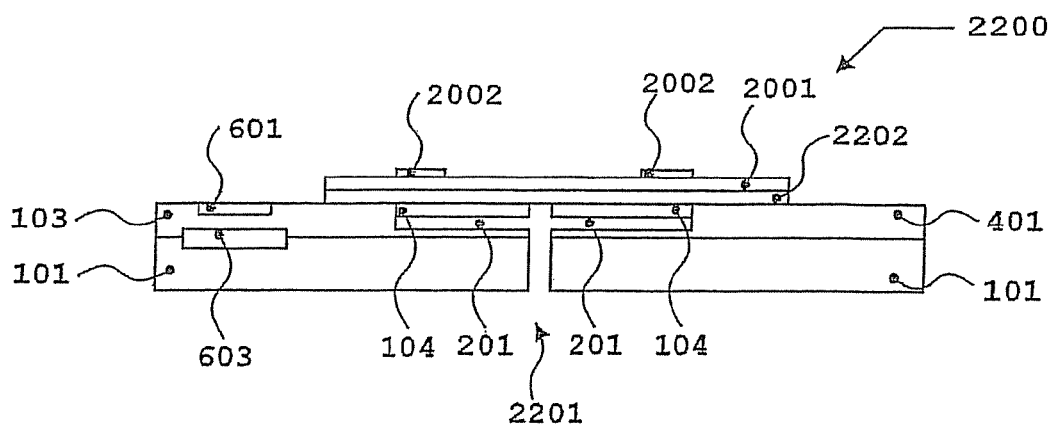
FIG. 22 is a cross-sectional view of a second example embodiment of a differential pressure sensor which has been produced on the basis of the absolute pressure sensor illustrated in FIG. 20.

FIG. 22 is a cross-sectional view of a second example embodiment of a differential pressure sensor which is produced on the basis of absolute pressure sensor 2000 illustrated in FIG. 20, with, in contrast to the preliminary stage illustrated in FIG. 20, an oxide layer 2202 additionally being provided between the top of silicon epitaxial layer 401 and sealing layer 2001. An opening 2201 is produced analogously to FIG. 21, e.g., by trench etching. The etching process stops at oxide layer 2202 in this case and the pressure is fed to hollow or cavity 201.

If sealing layer 2001 is formed by an oxide layer, an additional oxide layer 2202 may possibly be dispensed with. This may apply if the stability of sealing layer 2001 used as a membrane of the differential pressure sensor is sufficient.

What is claimed is:

1. A method for producing a semiconductor component, comprising:
    forming an n-doped layer in a p-doped layer of the semiconductor component, wherein the n-doped layer comprises at least one of: a sieve-like layer or a network-like layer having openings;
    porously etching the p-doped layer through the openings of the n-doped layer, the porously etched p-doped layer configured to form a top electrode of the semiconductor component, and
    forming a cavity below the n-doped layer.

2. The method according to claim 1, further comprising depositing a sealing layer on the top electrode, wherein the pressure prevailing during the deposition of the sealing layer defines the pressure in the cavity.

3. The method according to claim 1, further comprising forming a bottom electrode in the component below the top electrode, wherein the bottom electrode comprises at least one of: a second sieve-like layer or a second network-like layer.

4. The method according to claim 1, further comprising forming the p-doped layer on a semiconductor substrate using an epitaxial process prior to the forming of the n-doped layer in the p-doped layer.

5. The method according to claim 1, further comprising:
    producing the cavity by producing a second porous layer under the porously-etched p-doped layer, the second porous layer having a porosity of more than approximately 70%,
    wherein the cavity is produced from the second porous layer by an annealing step.

6. The method according to claim 1, wherein the semiconductor component includes at least one of: a multilayer semiconductor element, a micromechanical component or a pressure sensor.

7. The method according to claim 1, wherein the semiconductor substrate includes silicon.

8. The method according to claim 5, wherein the second porous layer has a porosity of approximately 85% to 95%.

9. The method according to claim 1, wherein the cavity forming step includes the substep of forming one of an access opening and a hollow open on one side in one of a direction of the porously-etched p-doped layer and a second porous layer.

10. The method according to claim 9, wherein the cavity forming step includes the substep of one of partially and completely removing at least one of the porously-etched p-doped layer and the second porous layer via the one of the access opening and the hollow open on one side.

11. The method according to claim 1, wherein the cavity forming step includes the substep of forming a single planar hollow under the porously-etched p-doped layer, and increasing a depth of the single planar hollow to form the cavity.

12. The method according to claim 5, wherein one of the porously-etched p-doped layer and the second porous layer is produced by at least one etching medium.

13. The method according to claim 5, wherein the semiconductor component includes a multilayer semiconductor element, and at least one of porously-etched p-doped layer and the second porous layer is produced in the respective producing step by applying an electrical field between a top and a bottom of the semiconductor element and establishing an electric current.

14. The method according to claim 11, wherein the single planar hollow forming step includes the substep of selecting process parameters so that one of pores and hollows of a second porous layer overlap one another in a lateral direction to form the single planar hollow.

15. The method according to claim 1, further comprising the step of depositing an epitaxial layer on the substrate.

16. The method according to claim 15, wherein the epitaxial layer includes a silicon layer.

17. The method according to claim 15, wherein the epitaxial layer includes a monocrystalline silicon layer.

18. The method according to claim 1, wherein the cavity is directly produced by an electrochemical etching step which includes:
   forming a single planar hollow under the porously-etched p-doped layer; and
   increasing a depth of the single planar hollow to form the cavity.

19. The method according to claim 18, wherein a current density of an electrochemical etching step to produce the porously-etched p-doped layer is increased to a current density in the electrochemical etching step to produce the cavity.

20. The method according to claim 1, further comprising the step of producing an opening from the back of the substrate, wherein the opening is connected to the cavity.

21. A method for producing a semiconductor component, comprising:
   forming an n-doped layer in a p-doped layer of the semiconductor component, wherein the n-doped layer comprises at least one of: a sieve-like layer or a network-like layer having openings;
   porously etching the p-doped layer through the openings of the n-doped layer, the porously etched p-doped layer configured to form a top electrode of the semiconductor component, and
   forming a cavity below the n-doped layer by producing a second porous layer under the porously-etched p-doped layer, the second porous layer having a porosity of more than approximately 70%,
   wherein the cavity is produced from the second porous layer by an annealing step.

22. A method for producing a semiconductor component, comprising:
   forming an n-doped layer in a p-doped layer of the semiconductor component, wherein the n-doped layer comprises at least one of: a sieve-like layer or a network-like layer having openings,
   porously etching the p-doped layer through the openings of the n-doped layer, the porously etched p-doped layer configured to form a top electrode of the semiconductor component, and
   forming a cavity below the n-doped layer,
   wherein the cavity forming step includes the substep of forming a single planar hollow under the porously-etched p-doped layer, and increasing a depth of the single planar hollow to form the cavity.

23. A method for producing a semiconductor component, comprising:
   forming an n-doped layer in a p-doped layer of the semiconductor component, wherein the n-doped layer comprises at least one of: a sieve-like layer or a network-like layer having openings,
   porously etching the p-doped layer through the openings of the n-doped layer, the porously etched p-doped layer configured to form a top electrode of the semiconductor component, and
   forming a cavity below the n-doped layer,
   wherein the cavity is directly produced by an electrochemical etching step which includes:
   forming a single planar hollow under the porously-etched p-doped layer; and
   increasing a depth of the single planar hollow to form the cavity.

* * * * *